United States Patent [19]

Taguchi

[11] Patent Number: 5,006,910
[45] Date of Patent: Apr. 9, 1991

[54] SEMICONDUCTOR MEMORY DEVICE AND METHOD FOR PRODUCING THE SAME

[75] Inventor: Masao Taguchi, Sagamihara, Japan
[73] Assignee: Fujitsu Limited, Kawasaki, Japan
[21] Appl. No.: 222,305
[22] Filed: Jul. 21, 1988

Related U.S. Application Data

[63] Continuation of Ser. No. 810,255, Dec. 18, 1985, abandoned.

[30] Foreign Application Priority Data

Dec. 29, 1984 [JP] Japan .................. 59-279911

[51] Int. Cl.⁵ .................. H01L 29/68; H01L 29/78; H01L 27/02
[52] U.S. Cl. .................. 357/23.6; 357/23.5; 357/51
[58] Field of Search .................. 357/23.6, 51, 23.5

[56] References Cited

U.S. PATENT DOCUMENTS

| | | | |
|---|---|---|---|
| 4,327,476 | 5/1982 | Iwai et al. ............... | 357/23.6 |
| 4,577,395 | 3/1986 | Shibata .................. | 357/23.6 |
| 4,688,063 | 8/1987 | Lu et al. ................ | 357/23.6 |
| 4,792,834 | 12/1988 | Uchida .................. | 357/23.6 |

FOREIGN PATENT DOCUMENTS

| | | | |
|---|---|---|---|
| 57-97210 | 12/1983 | Japan ..................... | 357/23.6 |
| 58-220444 | 12/1983 | Japan . | |
| 59-63757 | 4/1984 | Japan . | |
| 59-191373 | 10/1984 | Japan . | |
| 2138207A | 10/1984 | United Kingdom . | |

OTHER PUBLICATIONS

Patents Abstracts of Japan, vol. 8, No. 167, Aug. 2, 1984; & JP-A-59 63 757 (Nippon Denshin Denwa Kosha, Nov. 4, 1984, pp. 271-278.
Patents Abstracts of Japan, vol. 8, No. 70, Apr. 3, 1984; & JP-A-58 220 444 (Tokyo Shibaura Denki K.K.), Dec. 22, 1983, pp. 191-202.
European Search Report, #EP 85-40-2574, The Hague, Oct. 10, 1986.

Primary Examiner—Rolf Hille
Assistant Examiner—Wael Fahmy
Attorney, Agent, or Firm—Staas & Halsey

[57] ABSTRACT

A semiconductor memory device having a semiconductor substrate includes; a field oxide layer selectively formed on the semiconductor substrate, and a capacitor including an insulating layer formed on the surface of a trench formed in such a manner that at least an edge portion of the field oxide layer is removed. A conductive layer is formed on the insulating layer, a dielectric layer is formed on the conductive layer and an electrode is formed on the dielectric layer.

6 Claims, 8 Drawing Sheets

SEMICONDUCTOR MEMORY DEVICE AND METHOD FOR PRODUCING THE SAME

This is a continuation of co-pending application Ser. No. 810,255 filed on 12/18/85, now abandoned.

BACKGROUND OF THE INVENTION

1. Field of the Invention

The present invention relates to a semiconductor memory device and a method for producing the same. More particularly, it relates to a dynamic random access memory (DRAM) cell having a trench capacitor and a method for producing the DRAM cell.

2. Description of the Related Art

Conventionally, to miniaturize a DRAM cell, the cell area is reduced and in order to increase storage capacity of the miniaturized cell, trench capacitors are used to obtain a larger substantial capacitor area than that provided in a conventional plane area.

The above process, however, is disadvantageous in that when the trench capacitors are arranged close to each other, data stored therein is lost due to a punch-through phenomenon occurring between storage electrodes, and in that the capture of carriers generated in a semiconductor substrate by alpha ($\alpha$) ray irradiation is large, thereby causing soft errors.

To alleviate the above problems it is necessary to form impurity-implanted regions, having a concentration of an order 1 to 2 degrees higher than the concentration in the substrate, around the trench capacitor, thus decreasing the width of the depletion layer and forcing both capacitors to be located close together. However, in the above, an ion implantation process cannot be effectively used as the process for implanting impurities into the side surfaces of the trench capacitors.

To prevent the occurrence of the above problems, a semiconductor integrated circuit device is disclosed in Japanese Unexamined Patent Publication (Kokai) No. 59-191373 (hereinafter referred to as "the publication-373") filed on May 15, 1983.

According to the structure of the trench capacitor disclosed in the '373 publication, a storage electrode plate and an insulating film for the inner wall of the trench capacitor are formed around the capacitor dielectric film. By forming the insulating film on the inner wall of the trench capacitor, the generation of undesired depression regions, which extend from the respective trench capacitor to the semiconductor substrate and cause operational errors, can be avoided.

However, the above conventional trench capacitors are positioned on each side of a field oxide film having a so-called "bird's beak" formed at both ends thereof. The field oxide film having the bird's beak has minimum a width of about 2 $\mu$m, even if the most superior lithography techniques are used in the etching thereof.

Therefore, trench capacitors must be formed in a space having a width of at least 2 $\mu$m to accommodate the oxide film. Thus, the structure disclosed in the '373 publication has insufficient miniaturization effects, even though the above punch-through phenomenon is prevented by the formation of the storage electrode plate and the insulating film for the inner wall of the trench.

SUMMARY OF THE INVENTION

Accordingly, it is an object of the present invention to obviate the above mentioned problems by providing a semiconductor memory device wherein the punch-through phenomenon between storage electrodes is avoided.

It is a further object of the present invention to provide a semiconductor memory device wherein the capture of carriers due to $\alpha$-ray irradiation also can be avoided.

It is a still further object of the present invention to provide a method for producing the semiconductor memory device. Therefore, according to the present invention, there is provided a semiconductor memory device comprising: a semiconductor substrate; a field oxide layer selectively formed on the semiconductor substrate; a capacitor including an insulating layer formed on the surface of a trench formed in such a manner that at least an edge portion of the field oxide layer is removed, a conductive layer formed on the insulating layer, a dielectric layer formed on the conductive layer, and an electrode formed on the dielectric layer.

According to the present invention there is further provided a method for producing a semiconductor memory device comprising the steps of: selectively forming a field oxide layer on a surface of a semiconductor substrate; forming a trench in such a manner that at least an edge portion of the field oxide layer is removed; forming an insulating layer on the surface of the trench; forming, in the trench, a capacitor including a conductive layer formed on the insulating layer a dielectric layer formed on the conductive layer, and an electrode formed on the dielectric layer.

DESCRIPTION OF THE PREFERRED EMBODIMENTS

Before describing the preferred embodiments of the present invention, a further description of the prior art will be made.

Figure 1:
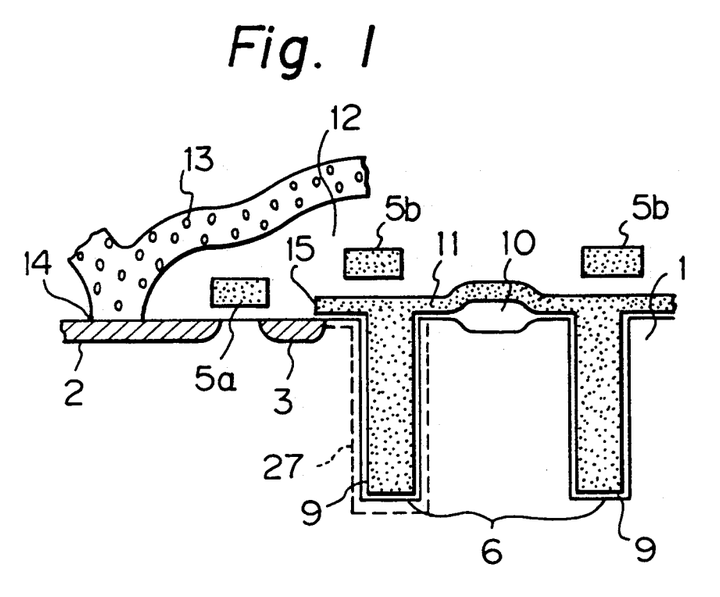
FIG. 1 is a cross sectional view of a conventional trench capacitor cell.
Figure 3:
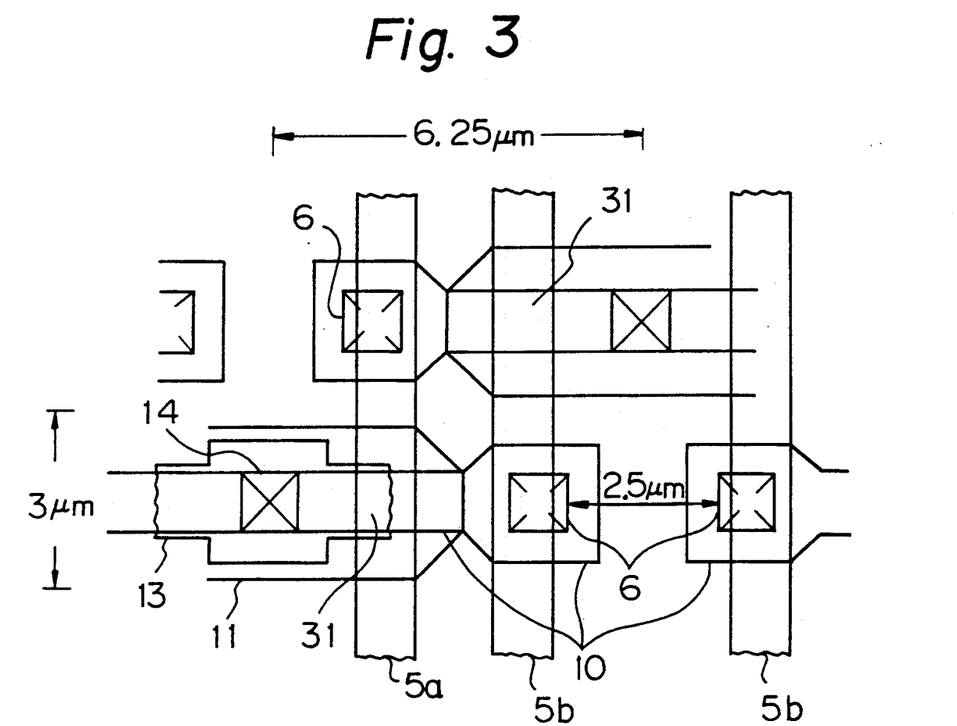
FIG. 3 is a plan view of FIG. 1.

FIG. 1 is a cross-sectional view of a conventional trench capacitor cell and FIG. 3 is a plan view of FIG. 1.

In FIGS. 1 and 3 on a surface of a p-type silicon substrate 1, drain and source regions 2 and 3 of n-type silicon are formed. Further, at a portion 31 (FIG. 3) of a word line 5a, a gate is formed. Thus, a transfer transistor is formed. A capacitor is formed by forming a trench 6 in the p-type silicon substrate 1, forming a capacitor dielectric film 9 therein, and forming a cell plate 11 of polycrystalline silicon as shown in FIG. 1. A capacitor is realized by the capacitor dielectric film positioned between an inversion layer 27 in the p-type silicon substrate 1 and a cell plate 11.

However, when the distance between the trenches 6 becomes too small, a depletion layer (not shown) extended from a capacitor portion of a cell is in contact with another depletion layer extended from a capacitor portion of an adjacent cell, and thus an injection current is caused to flow between the capacitors closely positioned, resulting in a loss of information (charges) stored in the capacitors. This is known as the punch-through phenomenon. The punch-through phenomenon occurs more often in capacitors having a deep trench.

Figure 2:
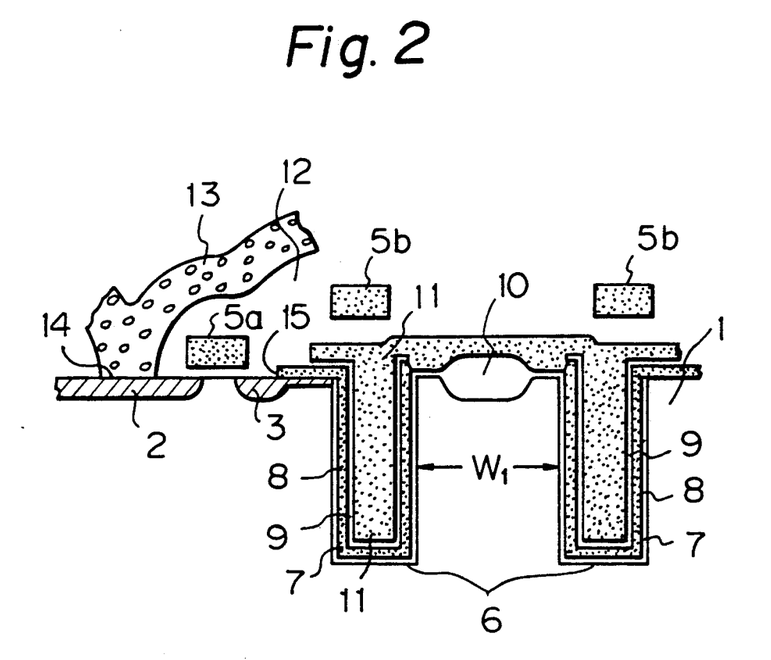
FIG. 2 is a cross sectional view of another conventional trench capacitor cell.

To prevent the punch-through phenomenon, the trench capacitor shown in FIG. 2 has been provided which is described in the above-mentioned '373 publication.

As shown in FIG. 2, in a trench 6, an insulating layer 7 and a storage electrode 8 are provided. The capacitor is realized by a capacitor dielectric film 9 positioned between an insulating layer 7 and a cell plate 11. The insulating layer 7 prevents the occurrence of a punch-through and the capture of carriers due to $\alpha$-ray irradiation. However, the distance $W_1$ between the trenches 6 is still about 2 $\mu$m. Thus, although the punch-through problem is solved, the miniaturization of the capacitor cannot be attained by the structure of FIG. 2.

Figure 4:
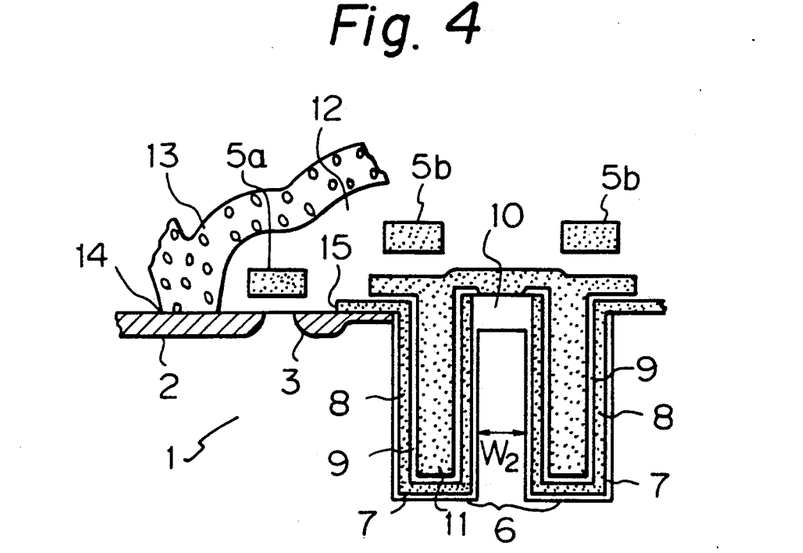
FIG. 4 is a cross sectional view of a DRAM cell according to the present invention.
Figure 5:
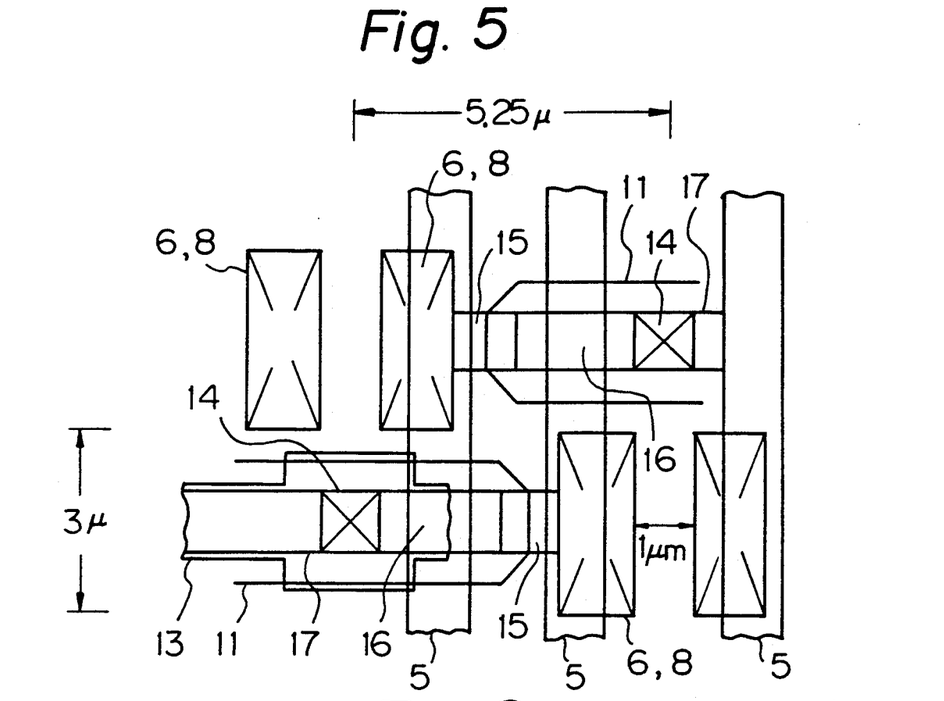
FIG. 5 is a plan view of FIG. 4.

FIG. 4 shows a cross sectional view of a DRAM cell according to the present invention and FIG. 5 shows a plan view of FIG. 4. As shown in FIG. 4 the structure of the DRAM cell according to the present invention is substantially similar to that of FIG. 2 except that the trenches 6 are positioned closer together. A feature of the present invention resides in the fact that each trench 6 is formed by removing, for example, a portion of p-type silicon substrate 1 and a part of a field oxide layer 10 subsequent thereto. As shown in FIGS. 4 and 5, to form a transfer transistor, drain and source regions 2 and 3 of n-type silicon are formed on the surface of the p-type silicon substrate 1. The drain and source regions 2 and 3 are positioned below a portion surrounded by a field oxide layer portion 17 in FIG. 5. Further, above a portion between the drain and source regions 2 and 3, a word line 5a of, for example, polycrystalline silicon, is formed through a field oxide layer 12.

The word line 5a is oriented in the vertical direction, as seen in FIG. 5 and acts as a gate electrode together with the drain and source regions 2 and 3 at portions 16 in FIG. 5, so that a transfer transistor is formed. The word lines 5b are formed only to connect transfer transistors closely positioned to each other. In the trenches 6 having an elongated rectangular shape, an insulating layer 7 of, for example, $SiO_2$, and a storage electrode 8 on the insulating layer 7 are formed. The storage electrode 8 is connected to the source region 3 of the transfer transistor by a contact 15. On the surface of the storage electrode 8 are formed a capacitor dielectric layer 9 of oxide of polycrystalline silicon and a cell plate 11 of polycrystalline silicon. Further, above the cell plate 11, a bit line 13 of, for example, aluminum, is formed through a field oxide layer 12, which is connected to the drain 2 of the transfer transistor by a contact 14. Capacitors formed in the closely positioned trenches are electrically connected to the cell plates 11 but physically isolated by the thick field oxide layer 10.

In the DRAM cell shown in FIGS. 4 and 5 a capacitor is formed by the capacitor dielectric layer 9 between the storage electrode 8 and the cell plate 11, and is electrically connected to the p-type silicon substrate 1 through the insulating layer 7. As explained in FIG. 2 the punch-through phenomenon and the capture of carriers due to $\alpha$ ray irradiation are also prevented in the structure of FIG. 4.

Furthermore, since the trench is also formed by removing the thick field oxide layer, the distance $W_2$ between trenches 6 is decreased. Thus, the cell area can be miniaturized to 3 $\mu$m $\times$ 5.52 $\mu$m = 16.56 $\mu$m$^2$ as shown in FIG. 5.

Figure 6:
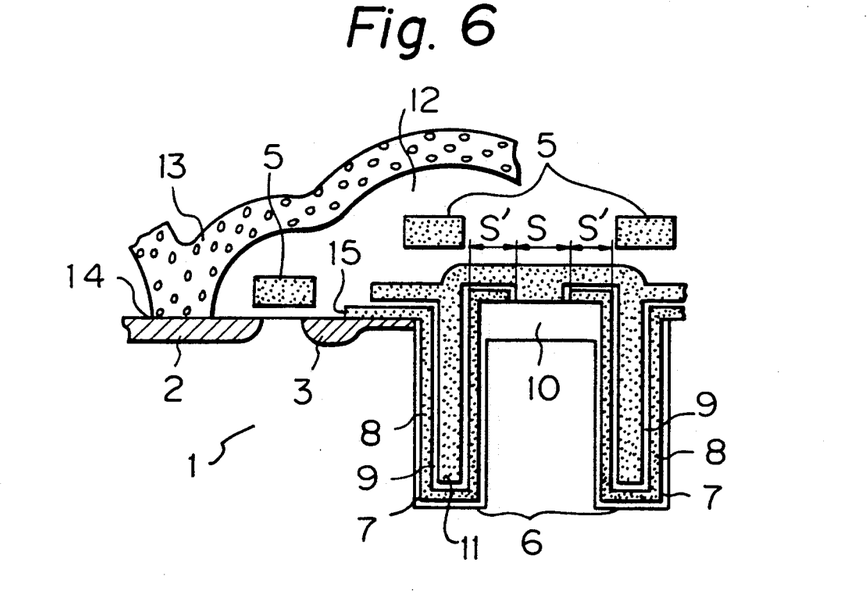
FIG. 6 is a cross sectional view of another DRAM cell according to the present invention.
Figure 7:
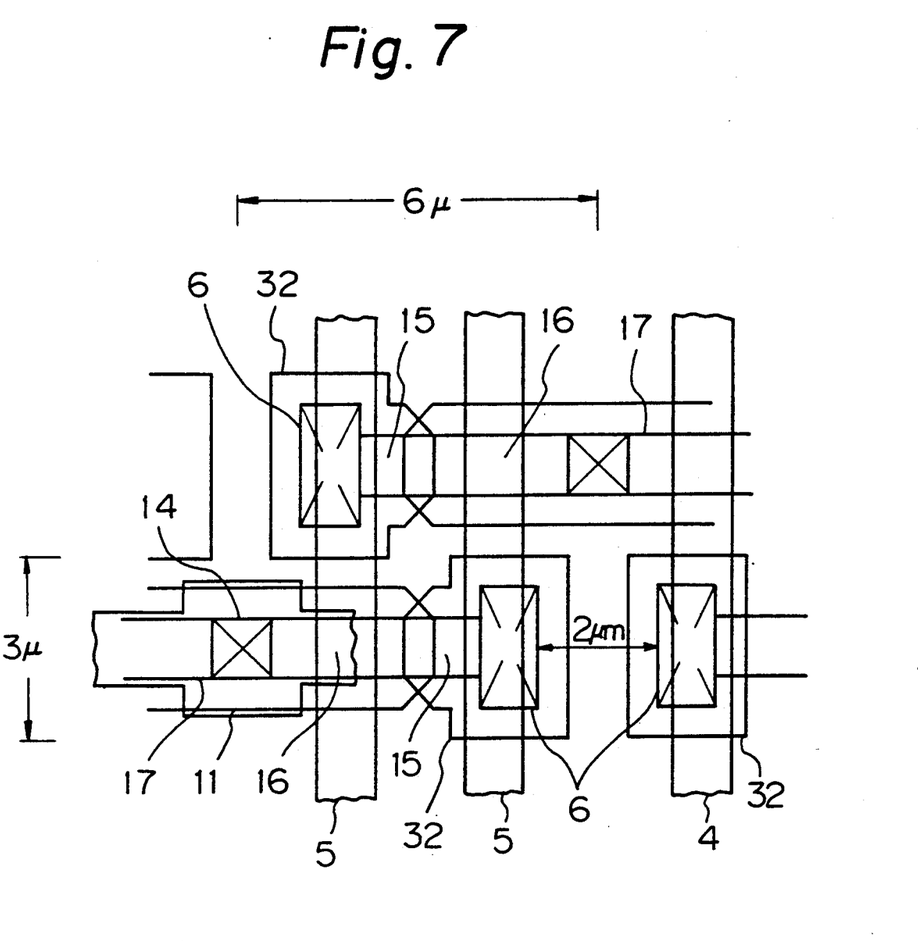
FIG. 7 is a plan view of FIG. 6.

FIG. 6 shows a cross sectional view of another DRAM cell according to the present invention, and FIG. 7 shows a plan view of FIG. 6.

The structure shown in FIGS. 6 and 7 is very similar to that of FIGS. 4 and 5 except that, on the thick field oxide layer 10, an extended portion (having a distance S') of the storage electrode 8 is made to align with the trench 6. Therefore the distance between the capacitors in the respective trenches 6 amounts to 2S' + S, which is larger than that of FIGS. 4 and 5. Specifically, the cell area becomes 3 $\mu$m $\times$ 6.25 $\mu$m = 18.75 $\mu$m$^2$.

FIGS. 8A to 8E are cross sectional views explaining steps of an example according to the present invention.

Figure 8A:
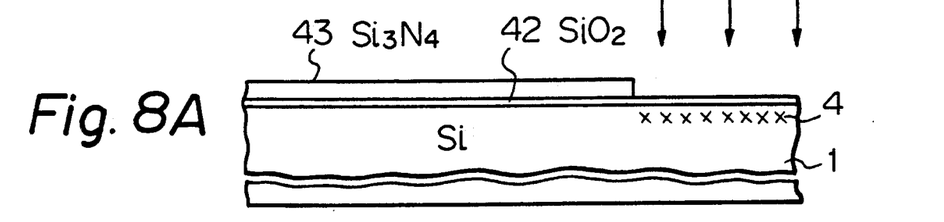
FIGS. 8A to 8H are cross sectional views for explaining steps of an example according to the present invention.

As shown in FIG. 8A, over a p-type silicon substrate 1, an insulating layer is formed by a well-known process. The layer is composed of double layers of $SiO_2$ 42 (having a thickness of about 500 Å) and $Si_3N_4$ 43 (having a thickness of about 2000 Å). The $Si_3N_4$ layer 43 is patterned to differentiate a circumferential circuit of the memory and an active region of a forwarding transistor of a memory cell from an isolation region. Then, an ion implanted layer 4 is formed.

Figure 8B:
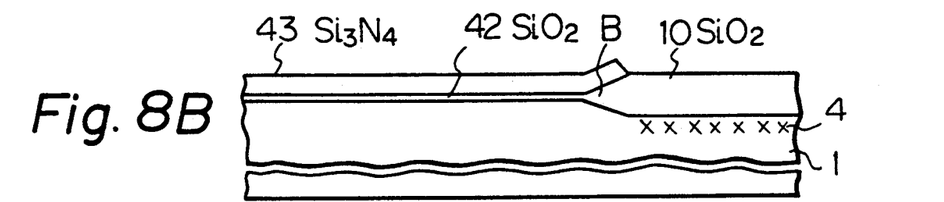

As shown in FIG. 8B the obtained wafer is entirely oxidized to form a field oxide layer 10 of $SiO_2$ (having a thickness of about 5000 Å). The above explained process is a conventional LOCOS process.

Figure 8C:
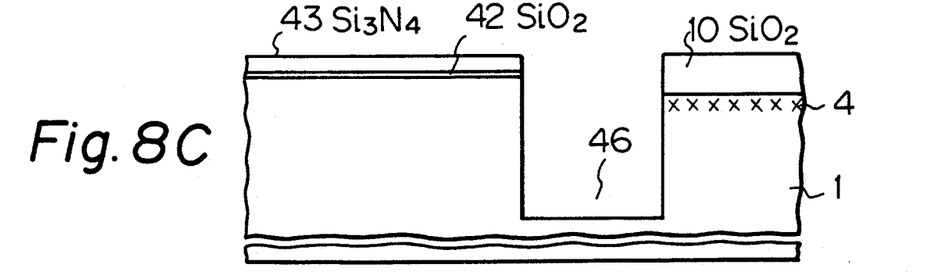

As shown in FIG. 8C, a part of the oxidation resistance layer in which a trench capacitor is to be formed is selectively removed by using a mask, and subsequently, the substrate positioned below this part of the insulating layer is removed by an etching process, using the same mask mentioned above, to form a trench having a depth of 5 $\mu$m. Thus, the trench 46 is formed so that it is positioned at a location in the substrate that includes a thin $SiO_2$ layer and thick field oxide layer 10 having a bird's beak B at the edge thereof (see FIG. 8B). In the formation of the trench, at first, both the silicon substrate and the field oxide layer 10 are simultaneously etched at substantially the same rate by using a reactive ion etching which has a strong sputtering quality, for example, Ar or $CHF_3$, etc.

Figure 8D:
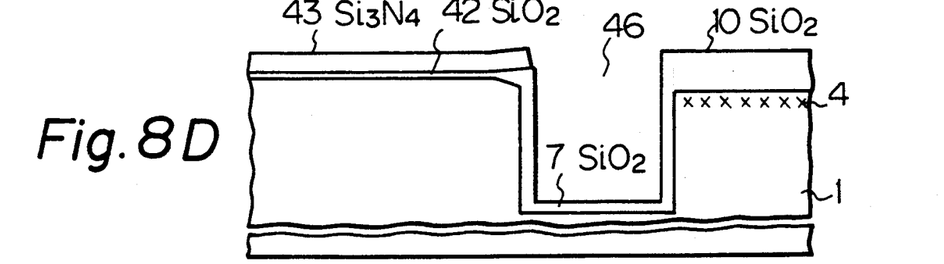

As shown in FIG. 8D, the obtained structure is then oxidized again. After that an insulating layer ($SiO_2$)7 (having a thickness of about 1500 Å) is selectively formed on the inner wall surface of the trench.

Figure 8E:
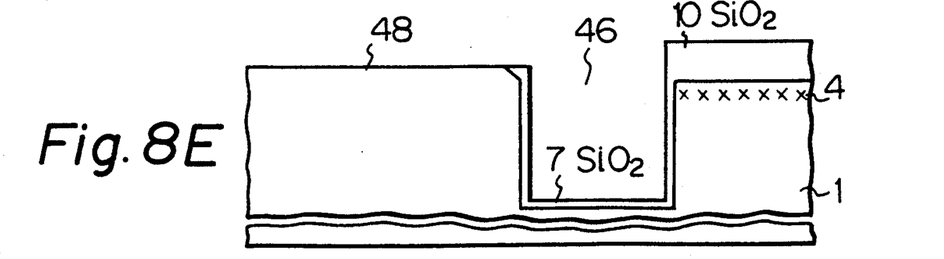

Then, as shown in FIG. 8E the insulating layer ($SiO_2$ 42, $Si_3N_4$ 43) is removed to expose the surface 48 of the silicon substrate 1 so that a capsule shaped insulating layer 7 is formed in the trench 6. By the process for removing the oxidation resistance layer, the insulating layer ($SiO_2$)7 of the trench 46 is removed to some extent so that the thickness of the insulating layer 7 becomes about 800 Å.

Figure 8F:
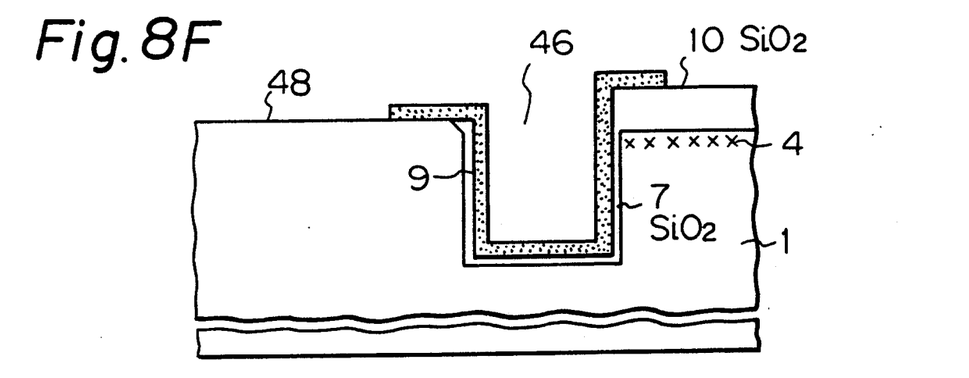

In order to form a capacitor surrounded by the capsule-shaped insulating layer 7, as shown in FIG. 8F, a polycrystalline silicon 8 is then deposited, formed to a thickness of about 1500 Å and patterned to the shape of the capacitor. The polycrystalline silicon 8 is doped to make it a conductive type opposite to that of the Si substrate, for example, if the Si substrate is p-type the polycrystalline silicon 8 is doped to an n-type, so that the polycrystalline silicon 8 acts as a charge storage electrode plate.

Figure 8G:
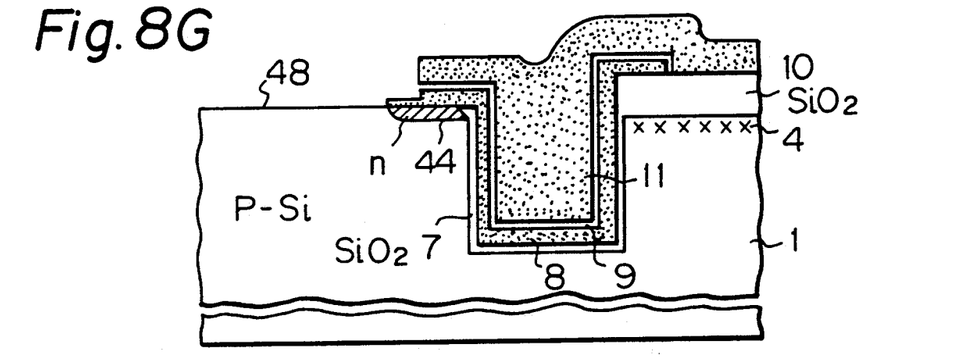

Then, as shown in FIG. 8G, a capacitor dielectric layer 9 is formed on the polycrystalline silicon 8 by oxidizing the surface thereof by a thermal oxidation process, to, for example, about 150 Å, while forming an n-type diffusion layer 4 in an Si substrate at the edge of the trench. The polycrystalline silicon 11 is then deposited in such a manner that the trench is filled so that an electrode, i.e., so-called self plate, is formed which acts as a capacitor.

Figure 8H:
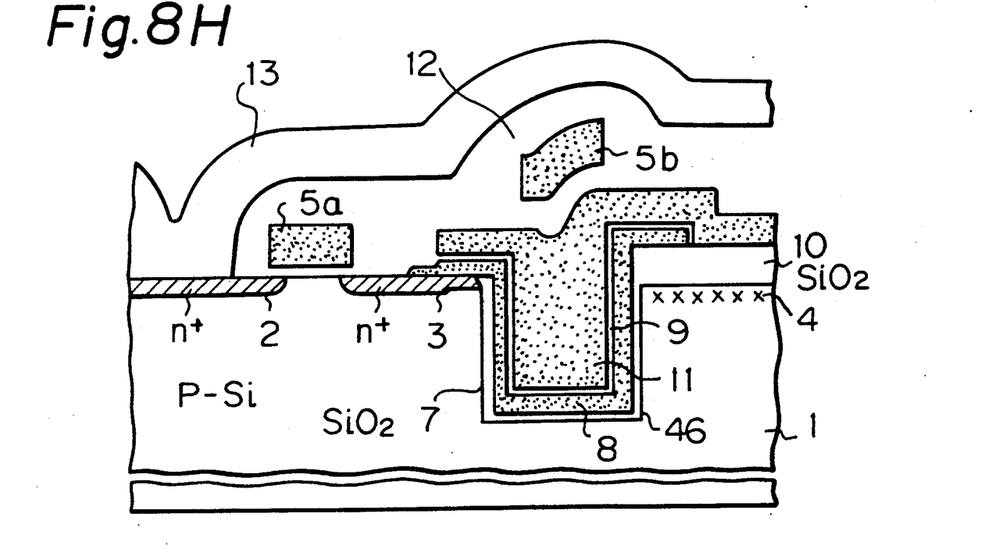
Figure 9:
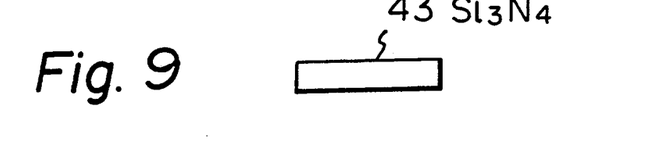
FIG. 9 is a plan view of FIG. 8B.
Figure 10:
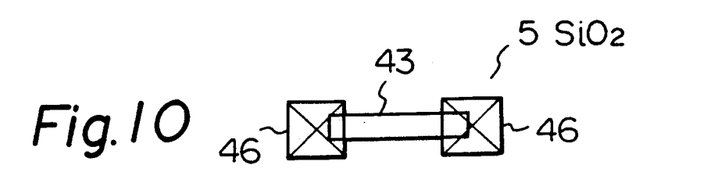
FIG. 10 is a plan view of FIG. 8C.
Figure 11:
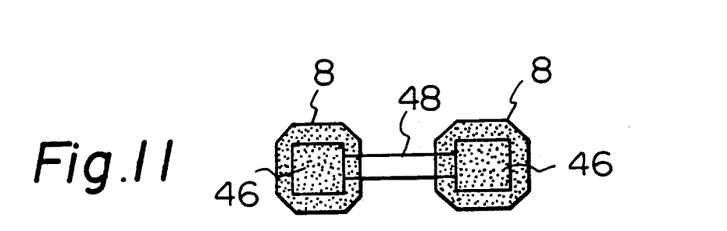
FIG. 11 is a plan view of FIG. 8F.
Figure 12:
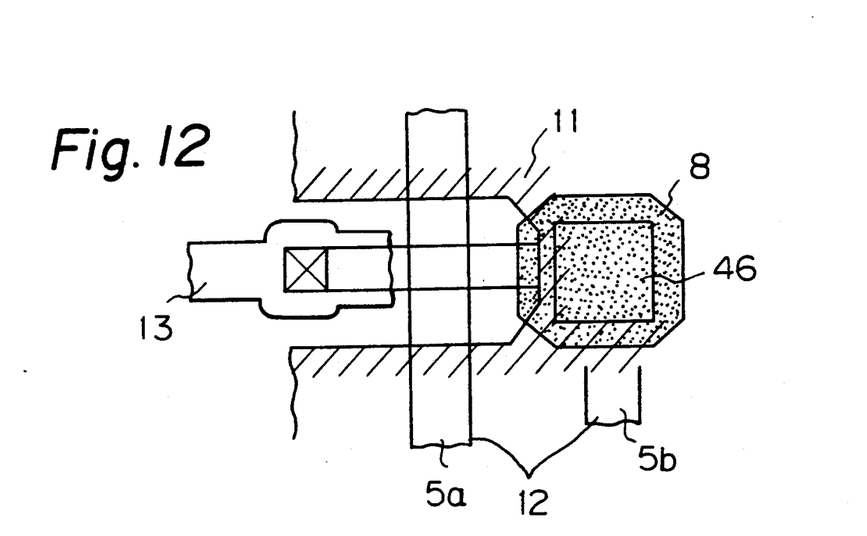
FIG. 12 is a plan view of FIG. 8H.

Then, as shown in FIG. 8H on an insulating layer positioned on the polycrystalline silicon and at the gate portion of a transfer gate transistor, word lines 5b and 5a are respectively formed by a well known process.

After the formation of the word lines 5a and 5b, a drain region 2 and a source region 3 are formed by an ion implantation process and activating heat treatment process. In this heat treatment n-type impurities are further diffused from the n-type diffusion region 4 and an n+ layer of the drain 3 is connected thereto without mask alignment, i.e., in self-alignment, at the edge of the trench 46. Further, a bit line 13 is also formed with the result that a DRAM cell shown in FIG. 8H can be obtained.

FIGS. 9 to 12 show plan views of FIGS. 8B, 8C, 8F, and 8H respectively.

Figure 13:
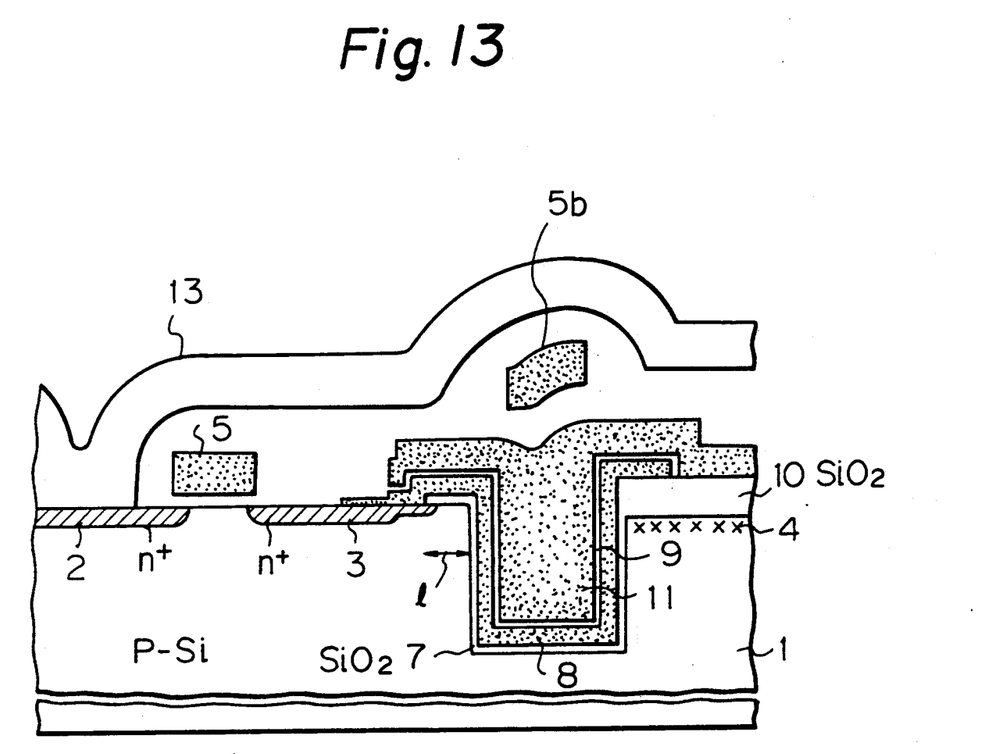
FIG. 13 is a cross-sectional view of a trench capacitor cell wherein a capacitor storage electrode plate is electrically connected to a source and a drain of a transfer gate transistor by using a mask alignment process not according to the present invention.

FIG. 13 shows a comparative example wherein a capacitor storage electrode plate is electrically connected to a source and a drain of a transfer gate transistor by using a mask alignment process not according to the present invention.

As shown in FIG. 13 if a contact hole is formed between the source and the drain regions in an insulating layer ($SiO_2$)7 extending to the surface of the Si substrate the margin (l in FIG. 13) required in the mask alignment between the contact hole and the edge surface of the trench causes an increase in the size of the memory cell. When the contact hole is positioned very near to the trench, the insulating layer ($SiO_2$)7 of the inner surface of the trench is likely to be broken. Thus, it is necessary to leave that margin to make the contact hole.

I claim:

1. A semiconductor memory device, comprising:
   a semiconductor substrate having a major surface and a trench with first and second sidewalls formed therein, the first sidewall being in a first plane;
   a field oxide layer selectively formed on the major surface of said semiconductor substrate, said field oxide layer having a major surface in a second plane, and a minor surface of said field oxide layer forming a continuation of said first sidewall substantially in the first plane;
   an insulating layer formed in the trench, covering said first sidewall and the minor surface of said field oxide layer, and extending to and being substantially flush with the major surface of said semiconductor substrate along said second sidewall; and
   a capacitor comprising:
   a conductive layer formed on said insulating layer, a first part of said conductive layer being formed on a part of said major surface of said field oxide layer and a second part of said conductive layer being formed in a third plane lower than the second plane and on the major surface of said substrate so as to cover the portion of said insulating layer that is flush with the major surface of said substrate;
   a dielectric layer formed on at least the first and second parts of said conductive layer; and
   an electrode formed on said dielectric layer, said electrode having a first portion formed over the second part of said conductive layer.

2. A semiconductor memory device according to claim 1, wherein said field oxide layer includes a bird's beak portion contacting the major surface.

3. A semiconductor memory device according to claim 1, further comprising:
   a plurality of additional trenches with first and second sides formed therein, adjacent sides of said plurality of additional trenches being separated by a distance of less than 2 μm;
   an insulating layer formed in each additional trench; and
   capacitors formed within said plurality of additional trenches, each of said capacitors including:
   a conductive layer formed on said insulating layers;
   a dielectric layer formed on said conductive layer; and
   an electrode formed on said dielectric layer.

4. A semiconductor memory device, comprising:
   a semiconductor substrate having a major surface and a trench formed therein, the trench having first and second sides formed in respective first and second plane;
   a field oxide layer formed on the major surface of said semiconductor substrate, said field oxide layer having a major surface in a third plane, and a minor surface of said field oxide layer formed in the first plane;
   an insulating layer formed in the trench, said insulating layer extending above the major surface of said semiconductor substrate on the first side of the trench and covering the minor surface of said field oxide layer, and said insulating layer extending to and being substantially flush with the major surface of said semiconductor substrate on the second side of the trench; and
   a capacitor formed within the trench, said capacitor including:
   a conductive layer formed on said insulating layer, a first part of said conductive layer being formed on a part of said major surface of said field oxide layer and a second part of said conductive layer being formed in a fourth plane lower than the third plane and on the major surface of said substrate so as to cover the portion of said insulating layer that is flush with the major surface of said substrate;
   a dielectric layer formed on at least the first and second parts of said conductive layer; and
   an electrode formed on said dielectric layer, said electrode having a first portion formed over the second part of said conductive layer.

5. A semiconductor memory device according to claim 4, wherein the substantially flush portion of said insulating layer is a bird's beak portion.

6. A semiconductor memory device, comprising:

a semiconductor substrate having a major surface and a plurality of trenches formed therein, each of the trenches having first and second sides formed in respective first and second planes;

a field oxide layer formed on the major surface of said semiconductor substrate, said field oxide layer having a major surface in a third plane and a plurality of minor surfaces, each minor surface being respectively formed in the first and second planes;

an insulating layer formed in each trench, said insulating layer extending above the major surface of said semiconductor substrate on the first side of each trench and covering the minor surfaces of said field oxide layer, and said insulating layer extending to and being substantially flush with the major surface of said semiconductor substrate on the second side of each trench; and capacitors respectively formed with said plurality of trenches, each of said capacitors including:
- a conductive layer formed on said insulating layer, a first part of said conductive layer being formed on a part of said major surface of said field oxide layer and a second part of said conductive layer being formed in a fourth plane lower than the third plane and on the major surface of said substrate so as to cover the portion of said insulating layer that is flush with the major surface of said substrate;
- a dielectric layer formed on the first and second parts of said conductive layer; and
- an electrode formed on said dielectric layer, said electrode having a first portion formed over the second part of said conductive layer.

* * * * *